United States Patent [19]

Imahashi

[11] Patent Number: 4,873,447
[45] Date of Patent: Oct. 10, 1989

[54] WAFER TRANSPORT APPARATUS FOR ION IMPLANTATION APPARATUS

[75] Inventor: Issei Imahashi, Tokyo, Japan

[73] Assignee: Tokyo Electron Limited, Tokyo, Japan

[21] Appl. No.: 145,689

[22] Filed: Jan. 15, 1988

Related U.S. Application Data

[63] Continuation of Ser. No. 848,567, Apr. 7, 1986, abandoned.

[51] Int. Cl.$^4$ ............................................. H01J 27/00
[52] U.S. Cl. ............................... 250/492.2; 250/442.1
[58] Field of Search ........................ 250/492.21, 442.1; 414/217, 222

[56] References Cited

U.S. PATENT DOCUMENTS

| | | | |
|---|---|---|---|
| 3,968,885 | 7/1976 | Hassan et al. | 250/217 |
| 4,550,239 | 10/1985 | Nehara et al. | 414/217 |
| 4,553,069 | 11/1985 | Purser | 250/492.21 |
| 4,558,984 | 12/1985 | Garrett | 414/222 |
| 4,619,573 | 10/1986 | Rathmann et al. | 414/222 |

Primary Examiner—Bruce C. Anderson
Attorney, Agent, or Firm—Oblon, Spivak, McClelland, Maier & Neustadt

[57] ABSTRACT

A wafer transport apparatus for an ion implantation apparatus includes means for successively transferring wafers from a wafer cassette, inserting the wafers into an auxiliary vacuum chamber, transferring the wafers into a specific position within a vacuum processing chamber, transferring a wafer from that position to a position for ion implanation processing while at the same time transferring a processed wafer to a second position within the vacuum processing chamber, with the wafers being held retained during this transfer, successively transferring the processed wafers into a second auxiliary vacuum chamber, and transporting the wafers from the second auxiliary vacuum chamber to be inserted into a cassette, e.g. the cassette from which the wafers were originally removed. The wafers are supported or held retained by the transfer and transport means during the entire process, so that problems resulting from gravity feed of wafers along inclined surfaces, which arise with prior art apparatus of this type, are eliminated.

13 Claims, 4 Drawing Sheets

WAFER TRANSPORT APPARATUS FOR ION IMPLANTATION APPARATUS

This application is a continuation of application Ser. No. 848,567, filed on Apr. 7, 1986, now abandoned.

BACKGROUND OF THE INVENTION

The present invention relates to a wafer transport apparatus for use in an ion implantation apparatus which performs ion implantation processing of wafers of material utilized to manufacture semiconductor devices, e.g. wafers of crystalline silicon (referred to in the following specification and claims simply as "wafers"). As is well known an ion implantation apparatus includes means for transporting wafers from the external atmosphere into an auxiliary vacuum chamber, and from there into a vacuum processing chamber in which ion implantation is performed. The wafers are then transferred from the vacuum processing chamber back to the auxiliary vacuum chamber and from there back out into the atmosphere. With prior art types of wafer transport apparatus for such an application, the weight of each wafer is employed to provide the motive force for this transportation, i.e. the force of gravity acting on each wafer is employed to slide the wafer along downwardly sloping surfaces. More specifically, such a prior art wafer transport apparatus comprises first inclined surface guidance means for transporting wafers from the external atmosphere into an auxiliary vacuum chamber, and from there into a vacuum processing chamber, together with second inclined surface guidance means, separate from the firs surface guidance means, for transferring the wafers from the vacuum processing chamber, through an auxiliary vacuum chamber, back to the external atmosphere. The wafers are successively moved downward as they slide along the inclined guidance surfaces, to be thereby successively transported to requisite positions.

Such a prior art wafer transport apparatus has the advantage that no drive apparatus is required. However it presents the following problems. Firstly, if a layer of photo-resist has been formed on each wafer, then sticking of the wafers may occur during the gravity transportation process, causing interruptions in production. Furthermore, the wafers may adhere to stopper members which are provided in the inclined surface guidance means. This problem can occur even with wafers which do not have a layer of photo-resist formed thereon. In addition, impact of the wafers against the stopper members results in the formation and accumulation of small wafer particles, resulting in build-up of dust, and also causes damage to the wafers.

Furthermore with such a prior art wafer transport apparatus, problems arise with regard to sequential transfer of wafers from a wafer cassette to an ion implantation processing section, and subsequent transfer of wafers from the ion implantation processing section to be loaded into a wafer cassette. Due to the above reasons, prior art types of wafer transport apparatus present serious problems with regard to production efficiency.

SUMMARY OF THE INVENTION

It is an object of the present invention to overcome the disadvantages of such a prior art type of wafer transport apparatus for use in an ion implantation apparatus.

In a first aspect, the present invention comprises a wafer transport apparatus for an ion implantation apparatus whereby wafers are transferred from a first auxiliary vacuum chamber to the interior of a vacuum processing chamber, and from the interior of the vacuum processing chamber to a second auxiliary vacuum chamber, respectively, by two drive means acting on a wafer transfer mechanism in a mutually synchronized manner.

In a second aspect, the present invention comprises a wafer transport apparatus for an ion implantation apparatus which incorporates a novel wafer transporting system whereby wafers are successively removed from a wafer cassette and are subsequently successively reloaded within the same cassette, following ion implantation processing.

More specifically, the present invention relates to a wafer transport apparatus for use in an ion implantation apparatus having a vacuum processing chamber containing ion implantation processing means, comprising:

first and second auxiliary vacuum chambers;

first wafer transfer means for transferring a wafer between said first auxiliary vacuum chamber and a first predetermined position within said vacuum processing chamber;

second wafer transfer means for transferring a wafer between said second auxiliary vacuum chamber and a second predetermined position within said vacuum processing chamber, and;

wafer retaining and transporting means for transferring two wafers within said vacuum processing chamber in a releasably retained condition, being operable to retain and transfer said two wafers between a third predetermined position within said vacuum processing chamber at which said ion implantation processing is performed and said first and second predetermined positions.

DESCRIPTION OF THE PREFERRED EMBODIMENTS

Figure 1:
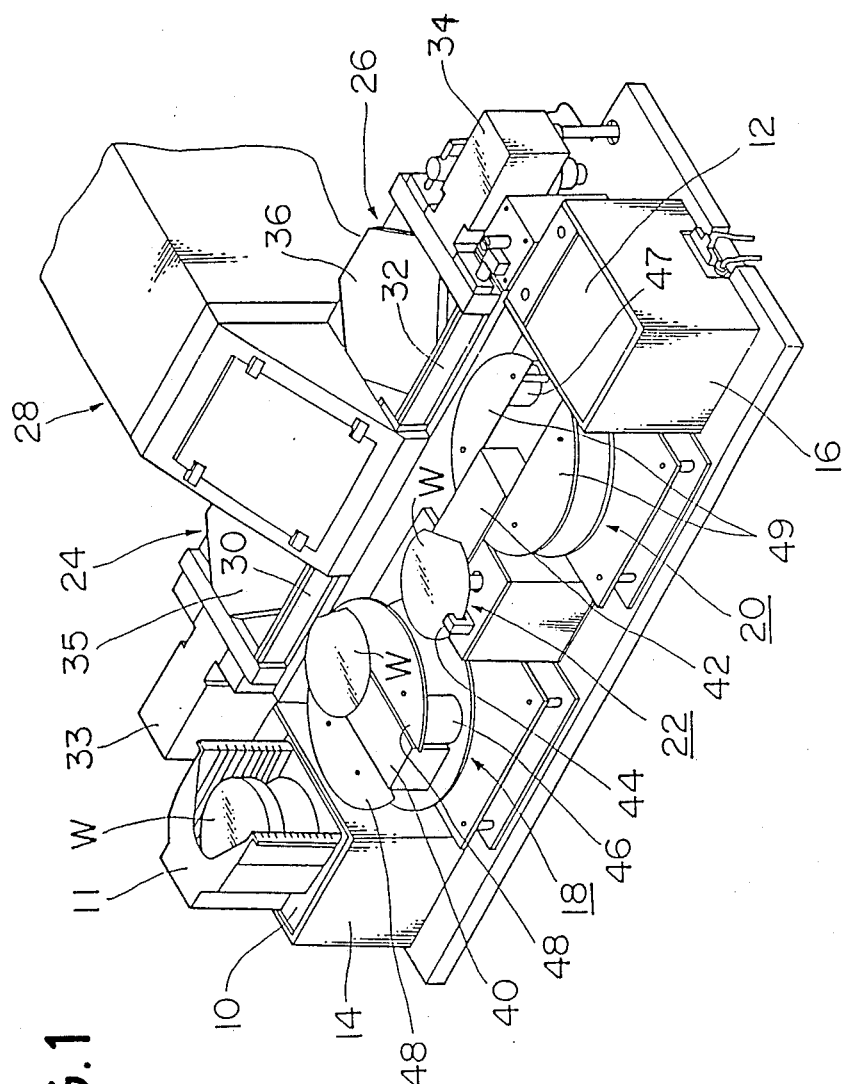
FIG. 1 is an oblique external view of an ion implantation apparatus incorporating an embodiment of a wafer transport apparatus according to the present invention.

An embodiment of the present invention will now be described, referring to FIGS. 1 through 4, in which corresponding components are designated by identical reference numerals. FIG. 1 is an oblique external view of an ion implantation apparatus incorporating an embodiment of a wafer transport apparatus according to the present invention, in which wafers are designated as W. Reference numerals 10 and 12 denote wafer cassette supporting stages mounted on respective elevating units 14 and 16, upon which are placed respective wafer cassettes each containing a plurality of wafers to be subjected to ion implantation processing. One of such wafer cassettes, designated as 11, is shown positioned upon wafer cassette mounting stage 10. Each of the elevating units 14 and 16 is operable to elevate or lower a wafer cassette supported thereon, by controlled amounts for bringing the wafer cassette to a requisite vertical position. The apparatus further includes wafer transport units 18 and 20, a wafer alignment unit 22, first and second auxiliary vacuum chambers 24 and 26, and a vacuum processing chamber 28.

As shown, a plurality of wafers are vertically stacked within the wafer cassette 11, each of which can be brought to a desired vertical position by operation of the elevating unit 14, for successive removal of wafers from wafer cassette 11 by the wafer transport unit 18 and for subsequent reloading of the wafers into specific positions in wafer cassette 11 by wafer transport unit 18 following ion implantation processing of the wafers, as described hereinafter. Although not shown in FIG. 1, a second wafer cassette can be placed upon wafer cassette supporting stage 12, mounted on elevating unit 16, and can be raised or lowered to specific positions as required for successive removal of wafers therefrom and subsequent reloading of the wafers thereof following ion implantation processing of the wafers, by operation of elevating unit 16.

The wafer transport unit 18 includes a wafer carrier member 40, and includes a drive mechanism which is operable to rotate wafer carrier member 40 in a horizontal plane about a fixed axis and to horizontally extend and retract wafer carrier member 40 radially with respect to that axis of rotation. One function of the wafer transport unit 18 is to remove wafers from wafer cassette 11 and to reload wafers into wafer cassette 11. Removal of a specific wafer is performed first by elevating unit 14 acting to raise wafer cassette 11 to a specific height, such that the lower face of a requisite wafer is slightly higher than the upper face of wafer carrier member 40, then by rotation of wafer carrier member 40 until one end thereof is positioned opposite the required wafer. The wafer carrier member 40 is then moved radially outward, to become positioned below the requisite wafer, whereupon elevating unit 14 acts to slightly lower the wafer cassette 11, leaving the requisite wafer supported upon wafer carrier member 40. The wafer carrier member 40 is then moved radially inward towards the axis of rotation thereof, carrying the requisite wafer out of wafer cassette 11.

To load a wafer into the wafer cassette 11, an opposite sequence of operations is performed. First, wafer cassette 11 is set to a specific vertical height by elevating unit 14. Next, wafer carrier member 40, carrying the requisite wafer at one end thereof, is rotated until that end is positioned opposite to wafer cassette 11, and is then moved radially outward to carry the wafer into a specific vertical position within wafer cassette 11. The wafer cassette 11 is then slightly lowered, to leave the requisite wafer supported therewithin, whereupon wafer carrier member 40 is moved radially inward, out of wafer cassette 11.

It should be noted that it would also be possible to perform the above rotation and extension/retraction operations of wafer carrier member 40 in a substantially simultaneous manner. However it would be necessary in this case to arrange the timings of rotational and linear movement of wafer carrier member 40 such as to avoid the possibility of obstruction to that movement occurring.

Furthermore, in the above description it is assumed that only the wafer cassette 11 is selectively raised and lowered in the process of performing removal of a wafer therefrom or loading a wafer therein. However it would be equally possible to provide elevating means in wafer transport unit 18, for producing slight amounts of vertical movement of wafer carrier member 40 to implement lifting of a wafer in wafer cassette 11 to become supported on wafer carrier member 40, for removal of a wafer from wafer cassette 11, or lowering of a wafer from wafer carrier member 40 to be left supported within wafer cassette 11, for loading a wafer in wafer cassette 11 as described above.

The operation of wafer transport unit 20, for removing a wafer from a wafer cassette positioned on supporting stage 12, is identical to that described above with respect to wafer cassette 11, and further description will be omitted.

The wafer transport unit 18 also has the functions of transferring wafers to and from the wafer alignment unit 22, transferring wafers to the interior of auxiliary vacuum chamber 24 and removing wafers from the interior of auxiliary vacuum chamber 24. Similarly, wafer transport unit 20 has the functions of transferring wafers to and from the wafer alignment unit 22, removing wafers from the interior of auxiliary vacuum chamber 26, and transferring wafers to the interior of auxiliary vacuum chamber 26. The wafer alignment unit 22 functions to detect a specific peripheral edge portion of a wafer which is placed thereon, by wafer transport unit 18 or 20, and to rotate the wafer, in a horizontal plane, into a specific orientation. To perform these functions, wafer alignment unit 22 includes a wafer supporting stage (disposed below a wafer W, and not visible in FIG. 1), which is rotatable, and also incorporates an edge detection unit 44 which can include for example a pair of photo-sensors. After a wafer has been transferred by wafer transport unit 18 or 20 onto the supporting stage of wafer alignment unit 22 and has been rotated thereby into a specific orientation, the wafer is then transferred to the interior of either auxiliary vacuum chamber 24 or 26, as described hereinafter.

The auxiliary vacuum chamber 24 can be hermetically sealed from the outer atmosphere or opened to that atmosphere, by closing or opening an outer gate 30. Similarly, the auxiliary vacuum chamber 26 can be hermetically sealed from the outer atmosphere or opened to that atmosphere, by closing or opening an outer gate 32. Reference numerals 33 and 34 denote covers which contain actuating mechanisms for performing various functions within the interiors of auxiliary vacuum chambers 24 and 26 respectively, e.g. valves, etc. Reference numerals 35 and 36 respectively denote viewing windows which are optically transparent and are provided in the exterior walls of auxiliary vacuum chambers 24 and 26 respectively. Reference numerals 46 and 47 denote drive units of the wafer transport units 18 and 20 respectively, for driving the wafer carrier members 40 and 42 respectively for rotation and radial extension and retraction, as described hereinabove. Reference numerals 48 and 49 denote upper cover plates of wafer transport units 18 and 20 respectively. The upper face of each of the cover plates 48 and 49 is positioned below the upper face of each of the wafer carrier members 40 and 42.

Wafer transfer operation external to the auxiliary vacuum chambers 24 and 26 is performed as follows. It will be assumed that a wafer in wafer cassette 11 is to be subjected to ion implantation, and that this wafer has been positioned at an appropriate height from removal from wafer cassette 11 by wafer transport unit 18. The wafer carrier member 40 is first rotated until one end thereof is positioned opposite wafer cassette 11, then is moved radially outwards (or is rotated while being moved radially outward) to a position below the wafer, and then removes the wafer from wafer cassette 11 as described hereinabove. The wafer carrier member 40 is then moved radially inward, then is rotated until the end thereof upon which the wafer is carried becomes positioned opposite wafer alignment unit 22, whereupon it is moved radially outward to leave the wafer supported on the supporting stage of wafer alignment unit 22. The wafer carrier member 40 is then again rotated, as the first stage in removing a second wafer from wafer cassette 11. The wafer alignment unit 22 then rotates the wafer supported thereon, into a specific orientation as described hereinabove. When this orientation is completed, wafer transport unit 20 moves the wafer carrier member 42 thereof radially outward to lift the wafer from wafer alignment unit 22, then moves wafer carrier member 42 radially inward and rotates the member until the end thereof which carries the wafer becomes positioned opposite outer gate 32 of auxiliary vacuum chamber 26. At this point, outer gate 32 is in the open state, and wafer carrier member 42 is then moved radially outward to insert the wafer into the interior of auxiliary vacuum chamber 26.

Subsequently, outer gate 32 closes, and the wafer which has been transferred therein is subjected to ion implantation within vacuum processing chamber 28 and transferred to auxiliary vacuum chamber 24, as described hereinafter. Outer gate 30 of auxiliary vacuum chamber 24 then opens, and wafer transport unit 18 then operates wafer carrier member 40 to remove this wafer from auxiliary vacuum chamber 24, and transports the wafer to a specific position within wafer cassette 11, by the loading operation described hereinabove. The wafer may for example be replaced in its original position within wafer cassette 11.

It can be understood from the above that the wafer transport unit 18, in addition to transporting wafers (prior to ion implantation) from the wafer cassette 11 to the wafer alignment unit 22, also serves to transport wafers (following ion implantation) from the auxiliary vacuum chamber 24 back into wafer cassette 11. In order to perform these two types of operation with maximum efficiency, it is possible to arrange for example that wafer transport unit transfers a wafer (prior to ion implantation) to the wafer alignment unit 22, then moves wafer carrier member 40 to transfer a wafer (following ion implantation) from auxiliary vacuum chamber 24 to be loaded into wafer cassette 11, then removes another wafer (prior to ion implantation) from wafer cassette 11, transfers that wafer to wafer alignment unit 22, and so on, repetitively.

With the present embodiment, while wafers are being successively removed from wafer cassette 11 mounted on supporting stage 10, it can be seen that wafers move successively in a path leading from wafer cassette 11, to wafer transport unit 18, to wafer alignment unit 22, to wafer transport unit 20, to auxiliary vacuum chamber 26, to vacuum processing chamber 28 for ion implantation processing, to auxiliary vacuum chamber 24, to wafer transport unit 18, then back into wafer cassette 11. During this processing of successive wafers of wafer cassette 11, another wafer cassette can be prepared, and set upon wafer cassette supporting stage 12. When all of the wafers of wafer cassette 11 have been processed, it is removed from supporting stage 10, to be replaced by another cassette. During this changeover interval, processing of the wafer cassette positioned on wafer cassette supporting stage 12 is initiated. The apparatus is now set to operate with a different processing flow path from that described above. Specifically, a wafer is removed from the wafer cassette on supporting stage 12, then is moved to wafer transport unit 20, to wafer alignment unit 22, to wafer transport unit 18, to auxiliary vacuum chamber 24, to vacuum processing chamber 28 for ion implantation processing, to auxiliary vacuum chamber 26, to wafer transport unit 20, then back into the wafer cassette on supporting stage 12. In this way, no production time is lost during the changeover of wafer cassettes on supporting stages 11 and 12, as the cassettes successively become completely processed and are replaced by other cassettes. It can therefore be understood that such an apparatus provides a very high level of production efficiency, with minimum waste of production time.

When all of the wafers of the wafer cassette positioned on stage 12 have been completely processed by ion implantation, the wafer cassette is replaced upon supporting stage 12 by another wafer cassette, and the wafers therein are then successively processed as described above. As stated previously, processing of wafers from a wafer cassette positioned on wafer cassette supporting stage 12 is performed during the changeover of wafer cassettes on supporting stage 10. Subsequently, upon completion of processing of the wafers of the wafer cassette on supporting stage 12, changeover of this wafer cassette is carried out. During this changeover, processing of the wafers in the wafer cassette on supporting stage 10 is performed.

Figure 2:
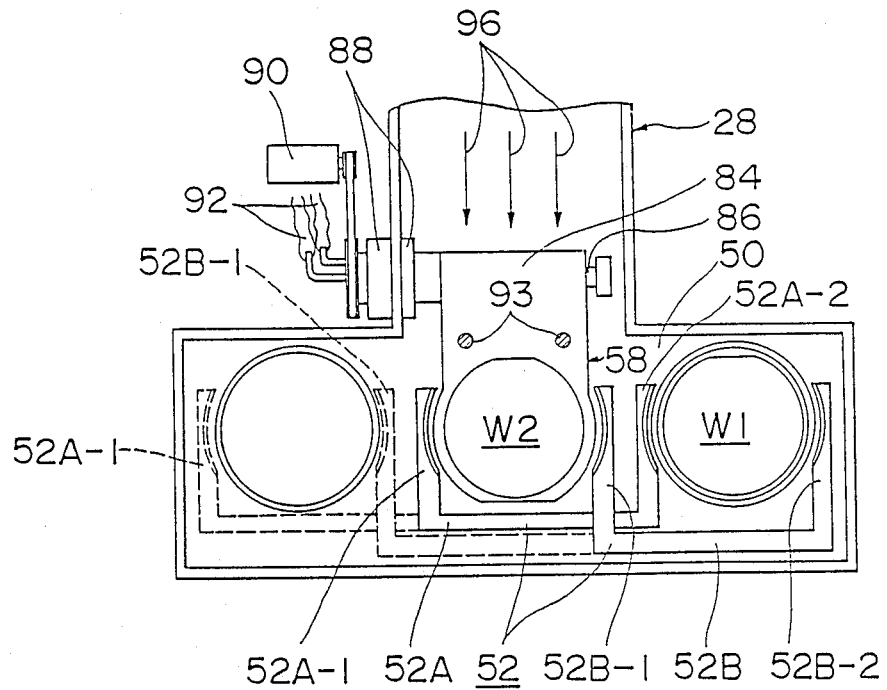
FIG. 2 is a general plan view of the interior of a vacuum processing chamber in the ion implantation apparatus of FIG. 1.
Figure 3:
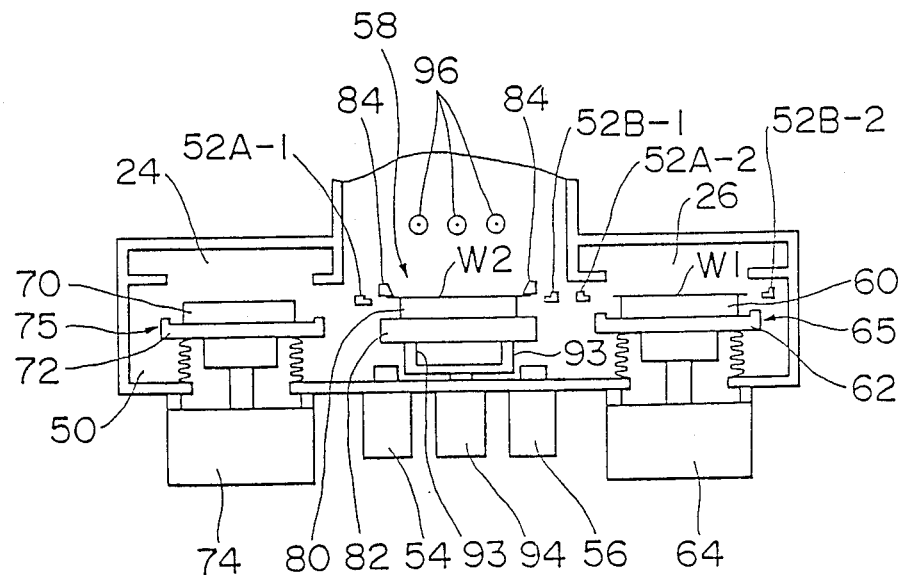
FIG. 3 is a cross-sectional view in elevation to illustrate the interior of the vacuum processing chamber and of two auxiliary vacuum chambers of the ion implantation apparatus of FIG. 1, showing a pair of wafer transfer units in a raised condition.
Figure 4:
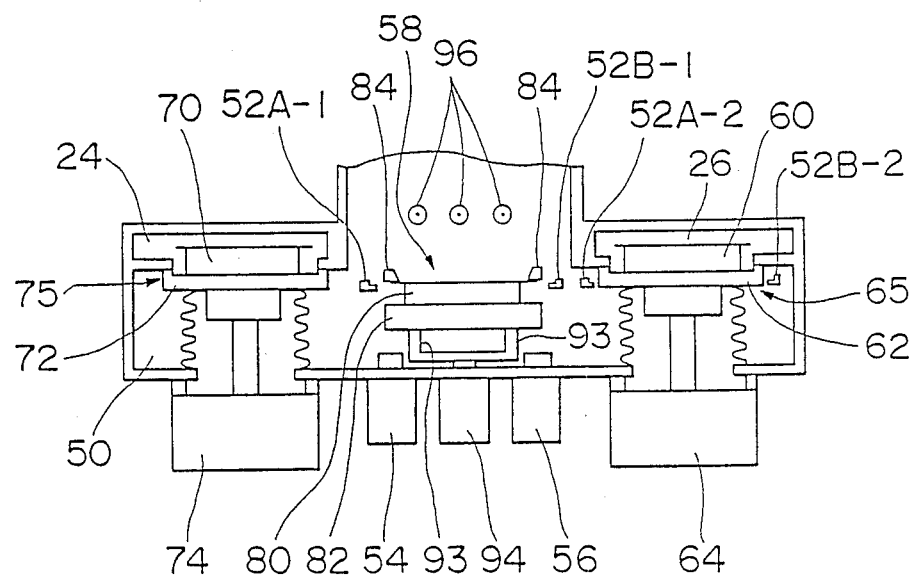
FIG. 4 is a cross-sectional view corresponding to FIG. 3, showing the pair of wafer transfer units in a lowered condition.

FIG. 2 is a general plan view of the interior region of vacuum processing chamber 28 in which ion implantation is performed, for assistance in describing the manner of transferring wafers within that chamber. FIG. 3 is a general cross-sectional view in elevation, showing the interior of vacuum processing chamber 28, and auxiliary vacuum chambers 24 and 26 in a condition in which each auxiliary vacuum chamber communicates with the vacuum processing chamber 28. FIG. 4 is a cross-sectional view corresponding to FIG. 3, showing a condition in which auxiliary vacuum chambers 24 and 26 are hermetically sealed with respect to vacuum processing chamber 28. In FIGS. 2 to 4, reference numeral 52 denotes a wafer retaining and transferring mechanism which serves to transfer wafers successively from a leftward position in vacuum processing chamber 28 (as seen in FIG. 2) to an ion implantation position, and then to a rightward position in vacuum processing chamber 28, or to transfer wafers from the rightward position, to the ion implantation position, then to the leftward position. The wafer retaining and transferring mechanism 52 includes two wafer retaining members 52A and 52B, respectively provided with arms 52A-1, 52A-2, and 52B-1, 52B-2. Arms 52A-1 and 52A-2 can be positioned to retainingly support the left-hand sides (as viewed in FIGS. 2 to 4) of two wafers respectively, for example the wafers designated as W1 and W2 in FIG. 2. Arms 52B-1 and 52B-2 can be positioned to retainingly support the right-hand sides of the latter two wafers respectively. The wafer retaining members 52A and 52B are respectively driven for horizontal linear movement (i.e. from right to left and from left to right, as seen in FIGS. 2 to 4) in a mutually synchronized manner, by drive units 54 and 56, each of which can include for example a stepping motor or a DC brushless motor, and a drive belt for coupling the motor to the corresponding wafer retaining member. Each of the arms 52A-1, 52A-2, 52B-1, 52B-2 of the wafer retaining members 52A and 52B is formed with a portion on one side thereof having an arc-shaped profile (as viewed in plan, in FIG. 2). Each of these arm side portions is formed to have a substantially L-shaped cross-sectional shape, as seen in FIGS. 3 and 4, whereby an arc-shaped horizontal ledge surface and vertical side surface is formed in each of these arc-shaped side portions, for respectively performing wafer supporting and wafer retaining functions as described hereinafter.

Reference numerals 65 and 75 denote wafer transfer units for respectively transferring wafers from auxiliary vacuum chamber 26 to the interior of vacuum processing chamber 28 and from auxiliary vacuum chamber 24 to the interior of vacuum processing chamber 28, by executing control upward and downward movement of platens 60 and 70 as described hereinafter. In the following description of the operation of wafer retaining and transferring mechanism 52, based on FIGS. 2 and 3 but assuming that a clamp member 84 has been set in the open state as described hereinafter, it is assumed that one wafer (W1) has just been transferred from auxiliary vacuum chamber 26 onto platen 60, while another wafer (W2) has just completed ion implantation processing, so that wafer W1 has to be transferred to the central ion implantation position and wafer W2 has to be transferred to the leftward position (below auxiliary vacuum chamber 24). In this condition, the horizontal arc-shaped shelf portions of each of arms 52A-1 to 52B-2 is positioned slightly below the lower faces of wafers W2 and W1, which are mutually positioned substantially in the same horizontal plane. The operation of wafer retaining and transferring mechanism 52 then is as follows. First, wafer retaining member 52A is driven to move slightly to the right, while wafer retaining member 52B is moved slightly to the left, by a sufficient amount to lightly clamp opposing edge portions of wafer W1 between the arc-shaped vertical surface portions of arms 52A-2 and 52B-2, and to similarly lightly clamp wafer W2 between the arc-shaped vertical surface portions of arms 52A-1 and 52B-1. The wafer retaining members 52A and 52B are then moved upward (or platens 60 and 80 are moved downward) by a sufficient amount to permit movement above platens 60 and 80 by wafer retaining members 52A and 52B. The wafer retaining members 52A and 52B are then moved together towards the left, carrying wafers W2 and W1, until the positions indicated by the broken-line outlines in FIG. 2 are reached. The wafer retaining member 52A is then moved slightly to the left, and wafer retaining member 52B is moved slightly to the right, by a sufficient amount to release the lightly clamped conditions of wafers W1 and W2, but leaving the wafers supported upon the horizontal arc-shaped shelf portions of arms 52A-1 to 52B-2. The wafer retaining members 52A and 52B are then move downward (or platens 70 and 80 are raised) by a sufficient amount to leave wafers W1 and W2 respectively supported on platens 70 and 80.

In this way, wafer W1 has been transferred to the position in vacuum processing chamber 28 at which it can be subjected to ion implantation (after rotational movement as described hereinafter), while wafer W2 has been transferred to platen 70 of wafer transfer unit 74, and can now be transferred into auxiliary vacuum chamber 24 by wafer transfer unit 74.

It will be apparent that transfer of wafers in the opposite direction to that described above, by operation of wafer retaining members 52A and 52B, can be performed in a similar manner to that described above. It can be understood from the above description that the manner of operation of wafer retaining and transferring mechanism 52 is similar to that of a shuttle.

The wafer platens 60, 70 and 80 are replaceable components, which can be selected in accordance with the size and shape of wafers which are to be processed. The wafer platen 60 is mounted on a member 62 which functions as an inner gate, to provide hermetic sealing between auxiliary vacuum chamber 26 and the interior of vacuum processing chamber 28 when set in an upward position thereof, as shown in FIG. 4, and to provide communication between auxiliary vacuum chamber 26 and the interior of vacuum processing chamber 28 when set in a downward position, as shown in FIG. 3. The inner gate 62 is raised and lowered by an elevating unit 64, which can be of hydraulic, pneumatic or electrical operation. The operation of elevating unit 64 is controlled by a control unit (not shown in the drawings). The inner gate 62, with elevating unit 64, platen 62 and the associated control unit, constitutes a wafer transfer unit 65.

Similarly, as shown at the left side of FIGS. 3 and 4, an inner gate 72 can be raised to provide hermetic sealing between auxiliary vacuum chamber 24 and the interior of vacuum processing chamber 28, and supports wafer platen 70. Controlled raising and lowering of inner gate 72 and wafer platen 70 is performed by an elevating unit 74 and an associated control unit (not shown in the drawings). The inner gate 72, with platen 70, elevating unit 74 and the associated control unit constitute a wafer transfer unit 75.

Reference numeral 58 in FIGS. 2 to 4 denotes an ion implantation processing positioning system, which includes wafer platen 80, a platen 82 for supporting wafer platen 80, a wafer clamp member 84, and a shaft 86 to which wafer clamp member 84 is fixedly attached, together with a motor 90 which is disposed external to vacuum processing chamber 28 and is coupled to rotate the wafer clamp member 84 through such means as an electrical sealed bearing 88, an actuating member 93 which bears against a lower face of platen 82, and a drive unit 94 for raising or lowering the actuating member 93. The processing positioning system 58 further includes means for cooling the interior of platen 82, to absorb heat which is generated by the ion implantation process. This is accomplished by forming platen 82 with a hollow interior, and circulating a coolant medium through this interior, the coolant being passed inward and outward through tubes 92. Numeral 96 indicates the direction of incident ions within vacuum processing chamber 28.

The operation of the processing positioning system 58 is as follows. Prior to transferring a wafer onto wafer platen 80, the platen is set in the position shown in FIGS. 3 and 4, by operation of drive unit 94 and actuating member 93, whereupon the wafer clamp member 84 is raise upward from the wafer that is currently supported upon wafer platen 80, by rotation of shaft 86 by motor 90. Transfer of another wafer onto wafer platen 80 is then carried out as described hereinabove, by operation of wafer retaining and transferring mechanism 52, and then motor 90 operates to rotate shaft 86 in the opposite direction, to thereby move wafer clamp member 84 downward to clamp the wafer between wafer clamp member 84 and wafer platen 80. Drive unit 94 then operates to drive actuating member 93 upward, to thereby rotate the clamped wafer about the axis of rotation of shaft 86, until the wafer has been moved into the appropriate position for ion implantation by incident ions 96. Upon completion of ion implantation, the above sequence of operations is reversed, to leave the wafer in the position indicated for W2 in FIG. 3.

In FIG. 4, both of the wafer transfer units 65 and 75 are shown in the respective upward positions thereof, whereby the auxiliary vacuum chambers 26 and 24 are hermetically sealed from the interior of vacuum processing chamber 28.

It should be noted at this point that, although it is preferable that the outer gates 30 and 32 and also the wafer transfer units 65 and 75 operate in a mutually synchronized manner, this is not essential to the present invention.

The overall operation of vacuum processing chamber 28 and of wafer transport through that chamber and auxiliary vacuum chambers 24 and 26 will now be described, referring to FIGS. 2 to 4. It should be noted that the following description is only given by way of example, and that the mode of operation of the present invention is not limited thereto. For ease of understanding, it will be assumed that the first wafer from wafer cassette 11 has been transported into auxiliary vacuum chamber 26, by respective operations of wafer transport unit 18, wafer alignment unit 22, and wafer transport unit 20. At this stage, both of the wafer transfer units 65 and 75 are in the raised condition as shown in FIG. 4, so that the auxiliary vacuum chambers 26 and 24 are hermetically sealed with respect to vacuum processing chamber 28 and both of the outer gates 30 and 32 are open. In this condition, the interiors of auxiliary vacuum chambers 26 and 24 are preferably filled with an inert gas such as nitrogen, at atmospheric pressure. The outer gates 32 and 30 are now closed, and the auxiliary vacuum chambers 26 and 24 are respectively evacuated to a specific pressure, for example to $10^{-2}$ Torr. When this is completed, the wafer transfer units 65 and 75 are lowered to the specific positions shown in FIG. 3, thereby setting both of the auxiliary vacuum chambers 24 and 26 in communication with the interior of vacuum processing chamber 28, which is held at a fixed level of vacuum, for example at $10^{-6}$ Torr. The first wafer is now transferred by wafer retaining and transferring mechanism 52 to the central position in processing positioning system 58, i.e. the position of wafer W2 in FIG. 2, with wafer retaining and transferring mechanism 52 moving leftward into the position indicated by the broken-line outline in FIG. 2. The wafer is then released from the retained condition by wafer retaining and transferring mechanism 52 as described hereinabove, to be transferred onto platen 80, whereupon wafer retaining and transferring mechanism 52 returns to the rightward position thereof (indicated by the full-line outline in FIG. 2). The wafer transfer unit 65 is then raised to the upward position thereof as shown in FIG. 4, to thereby hermetically seal auxiliary vacuum chamber 26 from vacuum processing chamber 28, whereupon outer gate 32 is opened and a second wafer from the wafer cassette is inserted into auxiliary vacuum chamber 26, to become supported on wafer platen 60 of wafer transfer unit 65. The outer gate 32 is then closed, and the interior of auxiliary vacuum chamber 26 is evacuated to the pressure level described above.

Prior to transfer of the first wafer onto platen 80, the wafer carrier clamp 84 is raised to the open condition, and is then lowered to clamp the wafer against platen 80 when this transfer has been completed. The first wafer is then moved to the ion implantation position by operation of actuating member 93. On completion of implantation processing, the first wafer is returned to the position shown in FIG. 3, and the clamp member 84 is raised to release the wafer.

Upon completion of ion implantation processing of the first wafer (for example, during the time interval in which the first wafer is being unclamped and restored to the position W2 shown in FIG. 3), the second wafer from the wafer cassette on unit 65 is lowered into the position shown for wafer W1 in FIG. 3. The first and second wafers are then respectively transferred by wafer retaining and transferring mechanism 52 onto wafer platens 70 and 80, leaving wafer retaining and transferring mechanism 52 in the position indicated by the broken-line outline in FIG. 2. The wafer transfer units 65 and 75 are now raised into the upward positions shown in FIG. 4.

While ion implantation processing of the second wafer is taking place, the third wafer from the wafer cassette on supporting stage 10 is transported into auxiliary vacuum chamber 26, while the first wafer is transferred out of auxiliary vacuum chamber 24, to be then reloaded into the wafer cassette.

Subsequent operations to process the remaining wafers of the wafer cassette on supporting stage 10 are simply repetitions of those described above. It can be understood that by appropriately mutually linking the timings of operations by the wafer transfer units 65 and 75, outer gates 30 and 32, and processing positioning system 58 in conjunction with the wafer transport units 18 and 20, a smooth and rapid flow of wafers from a wafer cassette, through ion implantation processing, and back into the wafer cassette, can be easily achieved.

In the above embodiment, a pair of wafer cassette supporting stages 10 and 12 are provided, at the right and left sides of the apparatus, with wafers from a wafer cassette on one of these supporting stages being processed while exchange of wafer cassettes on the other supporting stage is being carried out. However the present invention is not limited to this number of wafer cassette supporting stages, or to the described positions for these supporting stages. For example, both wafer cassette supporting stages may be positioned at the front of the apparatus. Furthermore, since the rate of processing of wafers within vacuum processing chamber 28 can be made extremely high, due to the manner of operation of an apparatus according to the present invention, it is possible that an increased rate of productivity can be achieved by employing a greater number of wafer cassette supporting stages, for example four supporting stages.

Alternatively, if means are provided for exchanging successive wafer cassettes at a sufficiently high speed, so that the time required to exchange cassettes on a supporting stage is not a limiting factor, then it would be possible to employ only a single wafer cassette supporting stage, e.g. supporting stage 10. In this case the apparatus would be as described for the preferred embodiment, but with the omission of supporting stage 12 and elevating unit 16, and with only a single flow path of wafers through the apparatus being employed.

With the present invention, as described hereinabove, a wafer is transferred from an auxiliary vacuum chamber into a vacuum processing chamber, is subjected to ion implantation processing therein, and is then transferred to a second auxiliary vacuum chamber. Such a system enables successive transfers of wafers into and out of the vacuum processing chamber to be carried out in a very smooth and efficient manner, and also enables wafers to be successively removed from a wafer cassette, processed by ion implantation, then loaded back into the wafer cassette, by successive cyclically repeated operations. As a result, maximum wafer transfer speed can be attained using a minimum of system components. Furthermore, the wafers are not subjected to impact during any stage of transportation within the apparatus. This results in the elimination of the problems of dust particle accumulation and of damage to wafers which arise with prior art types of such apparatus that employ sliding of wafers along inclined surfaces under the force of gravity, and impacts against stopper members, for wafer transfer. In addition the problems of wafers sticking within the transportation path, which arise with such prior art types of apparatus employing the force of gravity acting on the wafers, are eliminated.

Furthermore, since the time required to perform ion implantation processing of each wafer is quite short, and since the present invention enables extremely rapid transfer of wafers through the apparatus, a higher rate of processing can be achieved than has been possible in the prior art. Maximum advantage of this high processing rate can be attained, as described above, by using a greater number of wafer cassette supporting stages, e.g. four supporting stages. In this way, during processing of wafers from one cassette, exchange of a plurality of other cassettes on different wafer cassette supporting stages can take place, i.e. replacement of wafer cassettes containing wafers which have been completely processed with wafer cassettes containing wafers to be processed.

Although the present invention has been described in the above with reference to a specific embodiment, it should be noted that various changes and modifications to the embodiment may be envisaged, which fall within the scope claimed for the invention as set out in the appended claims. The above specification should therefore be interpreted in a descriptive and not in a limiting sense.

What is claimed is:

1. An ion implantation apparatus, comprising:
a vacuum processing chamber in which a wafer is subjected to ion implantation processing;
first and second auxiliary vacuum chambers each of which is hermetically sealable from or connectable to the outer atmosphere and vacuum processing chamber, and each of which is constructed to temporarily store the water;
first wafer transfer means for transferring a wafer into the vacuum processing chamber from the first auxiliary vacuum chamber;
second wafer transfer means for transferring the wafer to the second auxiliary vacuum chamber from the vacuum processing chamber;
driving means for driving the first and second wafer transfer means in a mutually synchronized manner;
wafer cassette supporting means for supporting a cassette containing a plurality of wafers; and
wafer transport means for transporting the wafer into the first auxiliary vacuum chamber from the cassette one by one;
said driving means being connected to the first and second wafer transfer means to move them at the same time so that two wafers are simultaneously transferred to the vacuum processing chamber and second auxiliary vacuum chamber from the first auxiliary vacuum chamber and vacuum processing chamber;
wherein said first wafer transfer means includes first and second arms, said second wafer transfer means includes third and fourth arms, and said driving means includes a first retaining member connecting the first and third arms together, and a second retaining member connecting the second and fourth arms together.

2. The apparatus according to claim 1, wherein said first, second, third, and fourth arms are arranged in parallel with one another, and said first retaining member has opposite ends connected to the first and second arms, and said second retaining member has opposite ends connected to the second and fourth arms, the first and second retaining members linearly moving in a parallel state.

3. An ion implantation apparatus, comprising:
a vacuum processing chamber in which a wafer is subjected to ion implantation processing;
first and second auxiliary vacuum chamber each of which is hermetically sealable from or connectable to the outer atmosphere and vacuum processing chamber, and each of which is constructed to temporarily store the wafer;
first wafer transfer means for transferring a wafer into the vacuum processing chamber from the first auxiliary vacuum chamber;
second wafer transfer means for transferring the wafer to the second auxiliary vacuum chamber from the vacuum processing chamber;
driving means for driving the first and second wafer transfer means in a mutually synchronized manner;
wafer cassette supporting means for supporting a cassette containing a plurality of wafers; and
wafer transport means for transporting the wafer into the first auxiliary vacuum chamber from the cassette one by one;
said first wafer transfer means including first and second arms;
said second wafer transfer means including third and fourth arms;
said driving means moving said first and second arms so that a first wafer becomes retained therebetween and moves said third and fourth arms so that a second wafer becomes retained therebetween;
wherein said first and third arms are fixedly connected to said first wafer transfer means and said second and fourth arms are fixedly connected to said second wafer transfer means, said driving means being operable to selectively;
(a) drive said first and second wafer retaining members in first mutually opposite directions, for retaining said first wafer between said first and second arms and retaining said second wafer between said third and fourth arms;
(b) drive said first and second wafer retaining members together along a specific direction, for transferring one of said first and second wafers from said first auxiliary vacuum chamber to said vacuum processing chamber while transferring the other wafer of said first and second wafers from said vacuum processing chamber to said second auxiliary vacuum chamber;

(c) drive said first and second wafer retaining members in second mutually opposite directions, for releasing said first wafer from between said first and second arms and releasing said second wafer from between said third and fourth arms; and (d) drive said first and second wafer retaining members together in the opposite direction to said specific direction.

4. An ion implantation apparatus, comprising:

a vacuum processing chamber in which a wafer is subjected to ion implantation processing;

first and second auxiliary vacuum chambers each of which is hermetically sealable from or connectable to the outer atmosphere and vacuum processing chamber, and each of which is constructed to temporarily store the wafer;

first wafer transfer means for transferring a wafer into the vacuum processing chamber from the first auxiliary vacuum chamber;

second wafer transfer means for transferring the wafer to the second auxiliary vacuum chamber from the vacuum processing chamber;

driving means for driving the first and second wafer transfer means in a mutually synchronized manner;

wafer cassette supporting means for supporting a cassette contacting a plurality of wafers; and wafer transport means for transporting the wafer into the first auxiliary vacuum chamber from the cassette one by one;

in which said first wafer transfer means comprises a first wafer platen for supporting a wafer, a first sealing gate, and a first elevating unit controllable for selectively raising and lowering said first wafer platen and said first sealing gate together, said first sealing gate establishing a sealing condition when raised to an uppermost position thereof, in which said first auxiliary vacuum chamber is hermetically sealed with respect to said vacuum processing chamber, and in which said second wafer transfer means comprises a second wafer platen for supporting a wafer, a second sealing gate, and a second elevating unit controllable for selectively raising and lowering said second wafer platen and said second sealing gate together, said second sealing gate establishing a sealing condition when raised to an uppermost position thereof, in which said second auxiliary vacuum chamber is hermetically sealed with respect to said vacuum processing chamber.

5. An ion implantation apparatus, comprising:

a vacuum processing chamber in which a wafer is subjected to ion implantation processing;

first and second auxiliary vacuum chambers each of which is hermetically sealable from or connectable to the outer atmosphere and vacuum processing chamber, and each of which is constructed to temporarily store the wafer;

first gate means which is hermetically sealable between the vacuum processing chamber and the first auxiliary vacuum chamber;

second gate means which is hermetically sealable between the vacuum processing chamber and the second auxiliary vacuum chamber;

first wafer transfer means for transferring a wafer into the vacuum processing chamber from the first auxiliary vacuum chamber through the first gate means;

second wafer transfer means for transferring the wafer to the second auxiliary vacuum chamber from the vacuum processing chamber through the second gage means;

driving means for driving the first and second wafer transfer means;

wafer cassette supporting means for supporting a cassette containing a plurality of wafers; and wafer transport means for transporting the wafer into the first auxiliary vacuum chamber from the cassette one by one;

wherein said first gate means includes a first gate provided in the first auxiliary vacuum chamber and movable to seal and connect between the first auxiliary vacuum chamber and the vacuum processing chamber, the first gate supporting one wafer to be subjected to ion implantation processing, and said second gate means includes a second gate provided in the second auxiliary vacuum chamber and movable to seal and connect between the second auxiliary vacuum chamber and the vacuum processing chamber, the second gate supporting one wafer which has been subjected to ion implantation processing.

6. An ion implantation apparatus comprising:

a vacuum processing chamber in which a wafer is subjected to ion implantation processing;

first and second auxiliary vacuum chambers each of which is hermetically sealable from or connectable to the outer atmosphere and vacuum processing chamber, and each of which is constructed to temporarily store the wafer;

first gate means which is hermetically sealable between the vacuum processing chamber and the first auxiliary vacuum chamber;

second gate means which is hermetically sealable between the vacuum processing chamber and the second auxiliary vacuum chamber;

first wafer transfer means for transferring a wafer into the vacuum processing chamber from the first auxiliary vacuum chamber through the first gate means;

second wafer transfer means for transferring the wafer to the second auxiliary vacuum chamber from the vacuum processing chamber through the second gate means;

driving means for driving the first and second wafer transfer means;

wafer cassette supporting means for supporting a cassette containing a plurality of wafers; and wafer transport means for transporting the wafer into the first auxiliary vacuum chamber from the cassette one by one;

said first wafer transfer means including first and second arms;

said second wafer transfer means including third and fourth arms;

said driving means moving said first and second arms so that a first wafer becomes retained therebetween and moves said third and fourth arms so that a second wafer becomes retained therebetween;

wherein said first and third arms are fixedly connected to said first wafer transfer means and said second and fourth arms are fixedly connected to said second wafer transfer means, said driving means being operable to selectively;
(a) drive said first and second wafer retaining members in first mutually opposite directions, for retaining said first wafer between said first and second arms and retaining said second wafer between said third and fourth arms;
(b) drive said first and second wafer retaining members together along a specific direction, for transferring one of said first and second wafers from said first auxiliary vacuum chamber to said vacuum processing chamber while transferring the other wafer of said first and second wafers from said vacuum processing chamber to said second auxiliary vacuum chamber;
(c) drive said first and second wafer retaining members in second mutually opposite directions, for releasing said first wafer from between said first and second arms and releasing said second wafer from between said third and fourth arms; and
(c) drive said first and second wafer retaining members together in the opposite direction to said specific direction.

7. An ion implantation apparatus, comprising:
a vacuum processing chamber in which a wafer is subjected to ion implantation processing;
first and second auxiliary vacuum chambers each of which is hermetically sealable from or connectable to the outer atmosphere and vacuum processing chamber, and each of which is constructed to temporarily store the wafer;
first gate means which is hermetically sealable between the vacuum processing chamber and the first auxiliary vacuum chamber;
second gate means which is hermetically sealable between the vacuum processing chamber and the second auxiliary vacuum chamber;
first wafer transfer means for transferring a wafer into the vacuum processing chamber from the first auxiliary vacuum chamber through the first gate means;
second wafer transfer means for transferring the wafer to the second auxiliary vacuum chamber from the vacuum processing chamber through the second gate means;
driving means for driving the first and second wafer transfer means;
wafer cassette supporting means for supporting a cassette containing a plurality of wafers; and
wafer transport means for transporting the wafer into the first auxiliary vacuum chamber from the cassette one by one;
in which said first wafer transfer means comprises a first wafer platen for supporting a wafer, and a first elevating unit controllable for selectively raising and lowering said first wafer platen and said first gate together, said first gate establishing a sealing condition when raised to an uppermost position thereof, in which said first auxiliary vacuum chamber is hermetically sealed with respect to said vacuum processing chamber, and
in which said second wafer transfer means comprises a second wafer platen for supporting a wafer, and a second elevating unit controllable for selectively raising and lowering said second wafer platen and said second gate together, said second gate establishing a sealing condition when raised to an uppermost position thereof, in which said second auxiliary vacuum chamber is hermetically sealed with respect to said vacuum processing chamber.

8. An ion implantation apparatus, comprising:
a vacuum processing chamber in which a wafer is subjected to ion implantation processing;
first and second auxiliary vacuum chambers each of which is hermetically sealable from or connectable to the outer atmosphere and vacuum processing chamber, and each of which is constructed to temporarily store the wafer;
first wafer transfer means for transferring a wafer into the chamber processing chamber from the first auxiliary vacuum chamber;
second wafer transfer means for transferring the wafer to the second auxiliary vacuum chamber from the vacuum processing chamber;
driving means for driving the first and second wafer transfer means in a mutually synchronized manner;
wafer cassette supporting means for supporting a cassette containing a plurality of wafers; and
first and second wafer transport means provided outside the vacuum processing chamber and auxiliary vacuum chambers, the first wafer transport means transporting the wafer to be subject to ion implantation processing to the second transport means from the cassette, and the wafer which has been subjected to ion implantation processing to the cassette from the second auxiliary vacuum chamber, and said second transport means transporting the wafer into the first auxiliary vacuum chamber from the first wafer transport means.

9. The apparatus according to claim 8, wherein:
said first wafer transfer means includes first and second arms;
said second wafer transfer means includes third and fourth arms; and
said driving means moves said first and second arms so that a first wafer becomes retained therebetween and moves said third and fourth arms so that a second wafer becomes retained therebetween.

10. The apparatus according to claim 9, wherein said first and third arms are fixedly connected to said first wafer transfer means and said second and fourth arms are fixedly connected to said second wafer transfer means, said driving means being operable to selectively:
(a) drive said first and second wafer retaining members in first mutually opposite directions, for retaining said first wafer between said first and second arms and retaining said second wafer between said third and fourth arms;
(b) drive said first and second wafer retaining members together along a specific direction, for transferring one of said first and second wafers from said first auxiliary vacuum chamber to said vacuum processing chamber while transferring the other wafer of said first and second wafers from said vacuum processing chamber to said second auxiliary vacuum chamber;
(c) drive said first and second wafer retaining members in second mutually opposite directions, for releasing said first wafer from between said first and second arms and releasing said second wafer from between said third and fourth arms; and
(d) drive said first and second wafer retaining members together in the opposite direction to said specific direction.

11. The apparatus according to claim 8 in which said first wafer transfer means comprises a first wafer platen for supporting a wafer, a first sealing gate, and a first elevating unit controllable for selectively raising and lowering said first wafer platen and said first sealing gate together, said first sealing gate establishing a sealing condition when raised to an uppermost position thereof, in which said first auxiliary vacuum chamber is hermetically sealed with respect to said vacuum processing chamber, and in which said second wafer transfer means comprises a second wafer platen for supporting a wafer, a second sealing gate, and a second elevating unit controllable for selectively raising and lowering said second wafer platen and said second sealing gate together, said second sealing gate establishing a sealing condition when raised to an uppermost position thereof, in which said second auxiliary vacuum chamber is hermetically sealed with respect to said vacuum processing chamber.

12. The apparatus according to claim 8, wherein:

said wafer cassette supporting means includes elevating means for controlling the vertical height of said wafer cassette;

said wafer transport means includes a first wafer carrier member formed to receive and support a wafer, and first drive means for rotating said first wafer carrier member about a first fixed axis and for moving said first wafer carrier member outward and inward with respect to said first fixed axis;

said second wafer transport unit includes a second wafer carrier member formed to receive and support a wafer, and second drive means for rotating said second wafer carrier member about a second fixed axis and for moving said second wafer carrier member outward and inward with respect to said second fixed axis;

said ion implantation apparatus further comprising a wafer alignment means adapted to support a wafer and including means for detecting a position of a wafer supported thereon and for rotating said wafer into a specific position based on said detection.

13. An ion implantation apparatus, comprising:

a vacuum processing chamber in which a wafer is subjected to ion implantation processing;

first and second vacuum chambers each of which is hermetically sealable from or connectable to the outer atmosphere and vacuum processing chamber, and each of which is constructed to temporarily store the wafer;

first wafer transfer means for transferring a wafer into the vacuum processing chamber from the first auxiliary vacuum chamber;

second wafer transfer means for transferring the wafer to the second auxiliary vacuum chamber from the vacuum processing chamber;

driving means connected to the first and second wafer transfer means for driving the first and second wafer transfer means in a mutually synchronized manner so that two wafers are simultaneously transferred to the vacuum processing chamber and second auxiliary vacuum chamber from the first auxiliary vacuum chamber and vacuum processing chamber;

said first wafer transfer means including first and second arms, said second wafer transfer means including third and fourth arms, and said driving means including a first retaining member connecting the first and third arms together, and a second retaining member connecting the second and fourth arms together.

* * * * *